United States Patent [19]

Toyoda et al.

[11] Patent Number: 4,815,037
[45] Date of Patent: Mar. 21, 1989

[54] BIPOLAR TYPE STATIC MEMORY CELL

[75] Inventors: Kazuhiro Toyoda, Yokohama; Chikai Ono, Kawasaki, both of Japan

[73] Assignee: Fujitsu Limited, Kawasaki, Japan

[21] Appl. No.: 549,003

[22] Filed: Nov. 3, 1983

Related U.S. Application Data

[63] Continuation of Ser. No. 207,735, Nov. 17, 1980, abandoned.

[30] Foreign Application Priority Data

Nov. 22, 1979 [JP] Japan .................. 54-151776

[51] Int. Cl.$^4$ .................. H01L 27/04; H03K 19/091; G11C 11/40
[52] U.S. Cl. .................. 365/156; 357/44; 357/46; 357/92
[58] Field of Search .................. 357/44, 46, 92; 365/155, 156

[56] References Cited

U.S. PATENT DOCUMENTS 3,909,807  9/1975  Fulton .................. 357/92
4,323,913  4/1982  Murrmann et al. .................. 357/50

FOREIGN PATENT DOCUMENTS 3016074  11/1980  Fed. Rep. of Germany ...... 365/155
53-43485   4/1978  Japan .
54-50279   4/1979  Japan .................. 357/48
508964     7/1971  Switzerland .

OTHER PUBLICATIONS

Hotta et al., IEEE J. of Solid State Circuits, vol. SC-13, No. 5, Oct. 1978, pp. 651–656.
Neus Aus Der Technik, No. 4, 1 Jul. 1969, p. 2.

Primary Examiner—William D. Larkins
Attorney, Agent, or Firm—Staas & Halsey

[57] ABSTRACT

A bipolar type static memory cell comprising two cross connected circuits, each of the circuits including a transistor and a load element is disclosed. An N-type epitaxial layer, grown on an N$^+$-type buried layer, is used as a collector region of the transistor, and a P-type layer formed in the N-type epitaxial layer and an N$^+$-type layer formed in the P-type layer are used as a base region and an emitter region of the transistor. A P-type diffusion layer is formed in the N-type epitaxial layer from the surface of the epitaxial layer to reach and contact the buried layer. The structure results in the memory cell parasitic diodes being effectively eliminated from the cell together with the unwanted charge storage effects of the diodes.

2 Claims, 4 Drawing Sheets

4,815,037

BIPOLAR TYPE STATIC MEMORY CELL

This application is a continuation of application Ser. No. 207,735, filed Nov. 17, 1980, now abandoned.

BACKGROUND OF THE INVENTION

The present invention relates to a bipolar type static memory cell with a flip-flop circuit.

The bipolar type static memory cell usually has a flip-flop circuit consisting of load resistors and multi-emitter transistors which are connected in a crossing manner. In such a flip-flop, a diode is often connected in parallel with the load resistor to increase the operation speed. The diode, in many cases, will be an SBD (Schottky barrier diode) because its carrier storage effect is small. Although the Schottky barrier diode has a small carrier storage effect and is suited for high-speed operation, it has a small voltage drop in the forward direction, so that the data is stored relying upon the small voltage in the forward direction. Accordingly, the Schottky barrier diode is sensitive to noises and, therefore, has a low noise margin. In order to avoid the above inconvenience, therefore, an ordinary diode of the pn junction type is often used. The diode of this type, however, has a large carrier storage effect, and causes the operation speed to be decreased as mentioned above.

SUMMARY OF THE INVENTION

The object of the present invention is to provide a bipolar type static memory cell having a high operation speed and a good noise margin.

Another object of the present invention is to provide construction of a diode for biasing a load resistor in the bipolar type static memory cell which has a high operation speed and a good noise margin.

In order to achieve the above-mentioned objects, the present invention deals with a semiconductor memory device having a memory cell made up of a flip-flop circuit comprising two circuits that are connected in a crossing manner, each of the circuits comprising a load resistor, a diode connected in parallel with the load resistor, and a transistor connected in series therewith. An N-type epitaxial layer is grown on an N+-type buried layer and serves as a collector region for the transistor. A P-type layer which is formed in the N-type epitaxial layer, and an N+-type layer which is formed in the P-type layer, serve as a base region and an emitter region of the transistor, respectively. A P-type diffusion layer is formed from the surface of the N-type epitaxial layer down to the buried layer, thereby to form the load resistor between the P-type diffusion layer and the P-type base layer, and to form the diode utilizing the P-type diffusion layer and the N+-type buried layer.

In order to achieve the above-mentioned object, the present invention deals with a bipolar type static memory cell which comprises a flip-flop circuit that is made up of two circuits connected in a crossing manner, each of the two circuits including a transistor and a diode connected in parallel between a base and an emitter of the transistor. The bipolar type static memory cell comprises an N-type epitaxial layer grown on an N+-type buried layer used as a collector region of the transistor, a P-type layer formed in the N-type epitaxial layer used as a base region and an N+-type layer formed in the P-type layer used as an emitter region of the transistor. A P-type diffusion layer is formed from the surface of the N-type epitaxial layer to reach the buried layer, whereby the load is formed by a PNP lateral transistor comprising the P-type diffusion layer, the P-type layer, and the N-type epitaxially grown layer between the P-type diffusion layer and the P-type layer.

Further features and advantages of the present invention will become apparent from the description with reference to the accompanying drawings by which, however, the scope of the invention is in no way limited.

DESCRIPTION OF THE PREFERRED EMBODIMENTS

Figure 1:
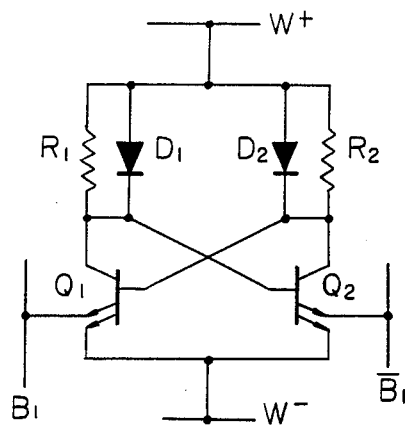
FIG. 1 is a circuit diagram of a bipolar type static memory cell.
Figure 2:
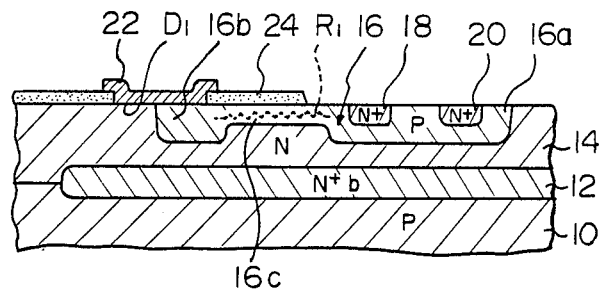
FIGS. 2, 3, 4, 5A and 5B are cross-sectional views illustrating the construction of the conventional memory cell of FIG. 1.

Referring to FIG. 1, a static memory cell consists of a flip-flop having load resistors $R_1$, $R_2$ and multi-emitter transistors $Q_1$, $Q_2$, that are connected in a crossing manner. In order to increase the operation speed, however, diodes $D_1$, $D_2$, having the polarities shown in FIG. 1, are often connected parallel with the load resistors $R_1$, $R_2$. Schottky barrier diodes (SBD), having a small carrier storage effect, are often used as the above diodes $D_1$, $D_2$. FIG. 2 illustrates a concrete example thereof, in which reference numeral 10 denotes a P-type silicon semiconductor substrate, 12 denotes an N+-type buried layer, 14 denotes an N-type epitaxially grown layer, 16 denotes a P-type diffusion layer, 18 and 20 denote N+-type diffusion layers, 22 denotes an aluminum electrode, and 24 denotes an insulation film composed of silicon dioxide, or the like. The N+-type layers 18, 20, in this case, serve as two emitter regions of the multi-emitter transistor $Q_1$, a portion 16a in the P-type layer 16 serves as a base region, and the N-type layer 14 serves as a collector region, thereby forming the transistor $Q_1$. A portion 16c having a narrow cross-sectional area in the P-type layer 16 serves as the resistor $R_1$, and an electrode 22 which connects to a portion 16b having a wide cross-sectional area, serves as a terminal that is connected to a word line $W^+$. The electrdoe 22 is Schottky barrier-contacted to the N-type layer 14 to form an SBD $D_1$ between the two. Although not diagrammed, the transistor $Q_2$ is also constructed in the same way. Symbol $W^-$ shown in FIG. 1 denotes a hold line, and $B_1$ and $B_1$ shown in FIG. 1 denote a pair of bit lines.

The Schottky barrier diode has a small electric charge storage effect and is suited for high-speed operation. It, however, has a small voltage drop in the forward direction, and must store the data in dependence upon the small voltage in the forward direction. Accordingly, the Schottky barrier diode is sensitive to noises and has a small noise margin. For the purpose of removing the above inconvenience, ordinary pn-junction diodes are often used, such as diodes $D_1$, $D_2$ illustrated in FIG. 3. The FIG. 3 cell is different from the cell of FIG. 2 in that portion 16b of the P-type layer 16 completely covers the lower portion of the electrode 22, and the diode $D_1$ (the same holds true for the diode $D_2$) is formed by the P-type layer 16b beneath the electrode 22 and by the N-type layer 14. The cell of this type exhibits an increased noise margin. However, since the cathode of the diode consists of an epitaxial layer 14 having a low impurity concentration, carriers are naturally stored in increased amounts in the N-type layer 14 to decrease the operation speed.

Figure 4:
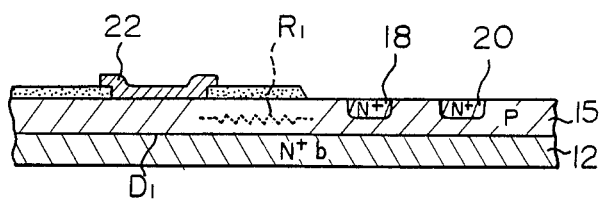

Therefore, it has previously been proposed to use pn+junction diodes that are constructed as shown in FIG. 4. In this case, a P-type epitaxial layer 15 is laminated on the N+-type buried layer, and N+-type diffusion layers 18 and 20 are formed in the P-type epitaxial layer 15, whereby the layer 18, 20 are utilized as emitter regions, the layer 15 is utilized as a base region, and the N+-type layer 12 is utilized as a collector region. The diode $D_1$ (the same holds true for the diode $D_2$) is formed by the layers 15, 12 beneath the electrode 22. In the pn+-junction diode having a high impurity concentration in the N+-type layer 12, the holes which are injected into the N+-type layer 12 undergo quick recombination and are extinguished and, hence, carriers are stored in small amounts. Further, the junction-type diode shown in FIG. 4 has a voltage in the forward direction which is greater than that of the Schottky barrier diode, and has a large noise margin. Technically, however, it is difficult to form the epitaxially grown layer having a small thickness. Consequently, the effective base width of the tansistor tends to be increased. When the base has a large thickness, the transistor exhibits a small $F_T$, as is widely known, which makes it difficult to realize high-speed operations.

Figure 3:
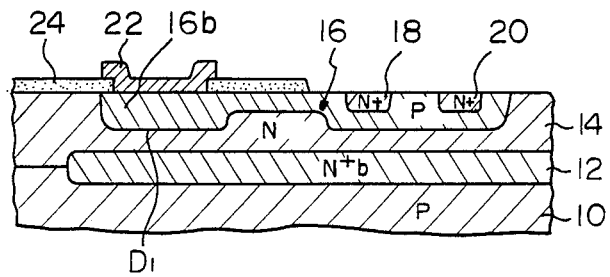
Figure 5A:
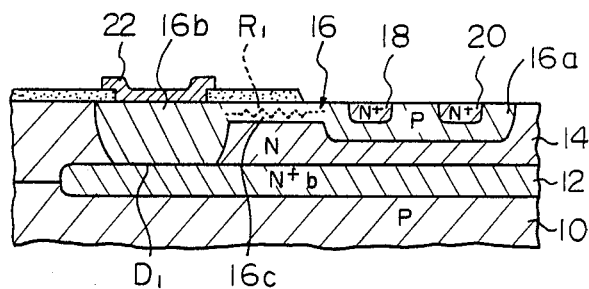

FIG. 5A illustrates a different version of the memory cell of FIG. 3, wherein the P-type diffusion layer 16 is made to contact the N+-type buried layer 12. With this construction, the diode $D_1$ (the same holds true for the diode $D_2$) can be formed by the layers 16 and 12, i.e., formed by the pn+-junction. In other words, the effects illustrated with reference to FIG. 4 can be obtained, i.e., the storage of the electric charges is decreased, the voltage drop is increased in the forward direction, and the noise margin is increased. Further, the N-type epitaxial layer 14 is grown, a P-type base diffusion layer 16a is formed in the N-type epitaxial layer independently of the layer 16b, and the N+-type emitter diffusion layer 18, 20 are formed. Therefore, the base can be formed while restraining the thickness of the effective base region to be comparable to that of the ordinary elements, such that a high-speed operation can be obtained. Practically speaking, the lower limit in the thickness of the epitaxial layer is from 1 to 2 $\mu$m, whereas the thickness of the diffusion layer can usually be arbitrarily selected to be smaller than 1 $\mu$m. Referring to the construction of FIG. 5, therefore, the thickness of layer 14 can be selected to be 2 $\mu$m, the thickness of the layer 16b to be from 1.5 to 2 $\mu$m, so that it comes into contact with layer 12, and the thickness of the base layer can be selected to be 0.2 or 0.3 $\mu$m independently of the layer 16b, thereby to form a transistor featuring a high $f_T$.

Figure 5B:
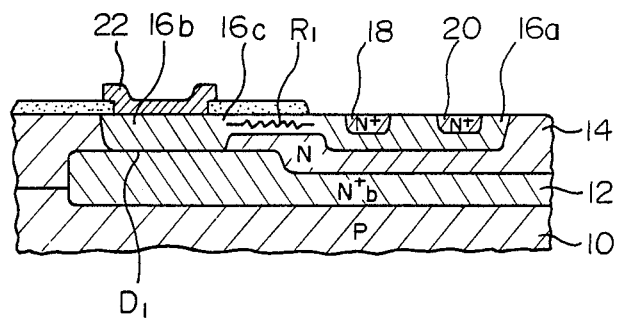

FIG. 5B illustrates an alternate version of the FIG. 5A structure in which a portion of the buried layer 12 is formed so as to reach the diffusion layer 16b. The memory of this embodiment, of course, produces effects that are the same as those of FIG. 5A.

Figure 6:
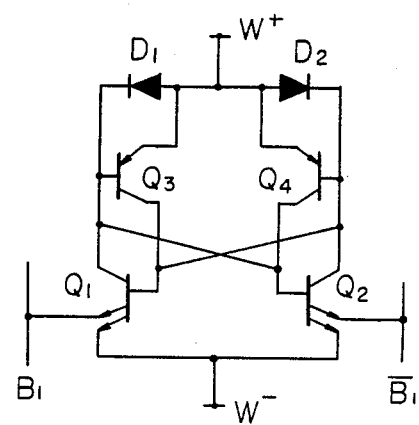
FIG. 6 is a circuit diagram of another bipolar type static memory cell.
Figure 7:
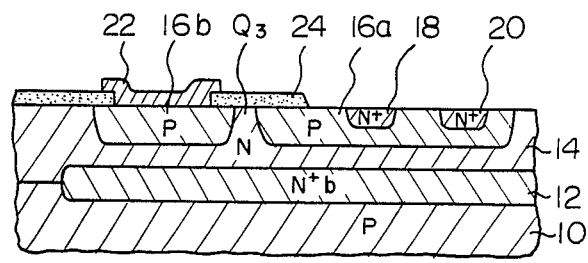
FIG. 7 is a cross-sectional view illustrating the construction of the conventional memory cell of FIG. 6.
Figure 8:
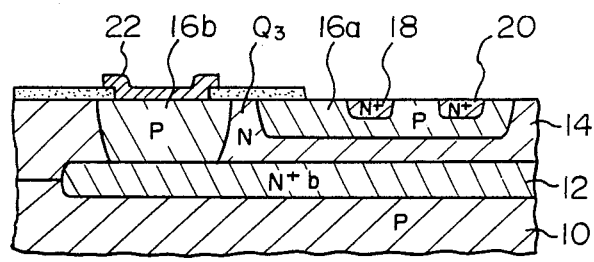
FIGS. 8, 9 and 10 are cross-sectional views illustrating embodiments of the present invention applied to the memory cell illustrated in the circuit diagram of FIG. 6.

There has also been proposed a bipolar type static memory cell in which the load resistors $R_1$ and $R_2$ are substituted for PNP transistors $Q_3$ and $Q_4$, as illustrated in FIG. 6. The present invention is applied to such a memory cell. The memory cell of FIG. 6 has heretofore been constructed as shown in FIG. 7, in which a transistor $Q_3$ (the same holds true for a transistor $Q_4$) is constructed in the form of a PNP lateral transistor by P-type diffusion layers 16a and 16b, and by the N-type epitaxial layer 14 located therebetween. Further, the parasitic diodes $D_1$, $D_2$ connected in parallel with the transistors $Q_3$ and $Q_4$ are constructed between the P-type diffusion layer 16b and the N-type layer 14. The diodes $D_1$ and $D_2$ in FIG. 6 can be regarded as portions of the emitter-base junctions of the PNP transistors $Q_3$ and $Q_4$, and need not be diagrammed in the equivalent circuit. However, they are indicated from the standpoint of illustrating the charge storage effect. In this case, as in the case of FIG. 3, holes injected into the N-type layer 14 are stored therein to decrease the operation speed. According to the present invention, however, the diode $D_1$ (and the diode $D_2$) is formed by the P-type diffusion layer 16b and the N+-type embedded layer 12 as shown in FIG. 8, in order to reduce the effect of storing electric charges and to obtain a sufficiently large noise margin.

Figure 9:
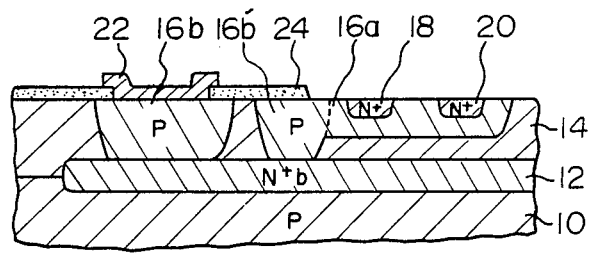

FIG. 9 illustrates another embodiment of the present invention wherein a portion of the P-type layer 16a is formed so as to contact the buried layer 12. In this case, the positions of the emitter and collector of the PNP transistor are self-aligned, and little variance is introduced into the characteristics.

Figure 10:
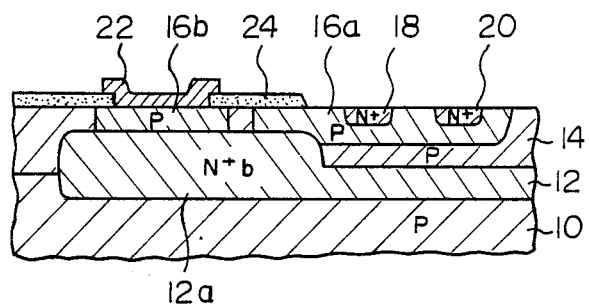

FIG. 10 illustrates a further embodiment of the present invention in which a portion 12a of the buried layer 12 is formed so as to reach the diffusion layers 16a and 16b. The memory cell of this embodiment, of course, produces effects that are the same as those of FIGS. 8 and 9. An emitter of the PNP transistor is formed by the P-type diffusion layer 16b and a collector of the same is formed by the P-type diffusion layer 16b'. In this embodiment both of the P-type diffusion layers 16b and 16b' reach the buried layer 12. But in other cases, P-type diffusion layer 16b' may not reach the buried layer 12.

According to the present invention, as illustrated in detail by the foregoing, there is provided a static memory cell which is simply constructed, operates at a high speed, and has an increased noise margin.

What is claimed is:

1. A bipolar type static memory cell including a flip-flop circuit comprising two cross connected circuits, each of said two circuits comprising a PNP lateral transistor load element and a transistor connected in series therewith, each transistor having a base, a collector and an emitter, said bipolar type static memory cell comprising:

an N+-type buried layer corresponding to the collector of said transistor;

an N-type epitaxial layer grown on the N+-type buried layer;

a P-type layer formed in said N-type epitaxial layer corresponding to the base of said transistor;

an n+-type layer formed in said P-type layer corresponding the emitter of said transistor;

P-type diffusion layers spaced from each other and formed from the surface of said eiptaxial layer to reach to and contact said buried layer, the emitter and the collector of said PNP lateral transistor being formed by respective portions of said P-type diffusion layers which reach to and contact said buried layer, and the collector of said PNP transistor being electrically connected to said P-type layer.

a portion of said N-type epitaxial layer being sandwiched between and separating said P-type diffusion layers, said PNP lateral transistor load element comprising said P-type diffusion layers, and said portion of said N-type epitaxial layer therebetween.

2. A bipolar type static memory cell including a flip-flop circuit comprising two cross connected circuits, each of said two circuits comprising a PNP lateral transistor load element and a transistor connected in series therewith, each transistor having a base, a collector and an emitter, said bipolar type static memory cell comprising:

an N+-type buried layer corresponding to the collector of said transistor;

an N-type epitaxial layer grown on the N+-the buried layer;

a P-type layer formed in said N-type epitaxial layer corresponding to the base of said transistor, said P-type layer extending to contact said buried layer;

an N+-type layer formed in said P-type layer corresponding to the emitter of said transistor;

a P-type diffusion layer spaced from said P-type layer and formed from the surface of said epitaxial layer to reach to and contact said buried layer;

a portion of said N-type epitaxial layer being sandwiched between and separating said P-type layer and said P-type diffusion layer, said PNP lateral transistor load element comprising said P-type diffusion layer, said P-type layer and said portion of said N-type epitaxial layer therebetween.

* * * * *